(12) United States Patent
Saito et al.

(10) Patent No.: US 9,761,531 B2
(45) Date of Patent: Sep. 12, 2017

(54) SEMICONDUCTOR DEVICE AND METHOD OF MANUFACTURING THE SAME

(71) Applicant: KABUSHIKI KAISHA TOSHIBA, Minato-ku, Tokyo (JP)

(72) Inventors: Tatsuro Saito, Yokkaichi Mie (JP); Masayuki Kitamura, Yokkaichi Mie (JP); Atsuko Sakata, Yokkaichi Mie (JP); Makoto Wada, Yokkaichi Mie (JP); Akihiro Kajita, Yokkaichi Mie (JP); Tadashi Sakai, Yokohama Kanagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 14/842,545

(22) Filed: Sep. 1, 2015

(65) Prior Publication Data
US 2016/0268210 A1   Sep. 15, 2016

(30) Foreign Application Priority Data

Mar. 13, 2015   (JP) .................................. 2015-051162

(51) Int. Cl.
*H01L 23/532*   (2006.01)
*H01L 21/768*   (2006.01)

(52) U.S. Cl.
CPC .. *H01L 23/53276* (2013.01); *H01L 21/76861* (2013.01); *H01L 21/76876* (2013.01); *H01L 21/76885* (2013.01)

(58) Field of Classification Search
CPC ........... H01L 23/53276; H01L 29/1606; H01L 21/02527; Y10S 977/734

(Continued)

(56) References Cited

U.S. PATENT DOCUMENTS

| 8,378,335 B2* | 2/2013 | Yamazaki ............. B82Y 10/00 257/29 |
| 2010/0021819 A1* | 1/2010 | Zhamu .................. H01G 9/058 429/231.8 |

(Continued)

FOREIGN PATENT DOCUMENTS

| JP | 2009070911 A | 4/2009 |
| JP | 2012054303 A | 3/2012 |

OTHER PUBLICATIONS

Azad Naeemi, et al., "Conductance Modeling for Graphene Nanoribbon (GNR) Interconnects", IEEE Electron Device Letters, vol. 28, No. 5, May 2007, pp. 428-431.

*Primary Examiner* — Moazzam Hossain
(74) *Attorney, Agent, or Firm* — Holtz, Holtz & Volek PC

(57) ABSTRACT

According to one embodiment, a semiconductor device is disclosed. The device includes interconnects each including a catalyst layer and a graphene layer thereon. The catalyst layer includes a first to fifth catalyst regions arranged along a first direction in order of the first to fifth catalyst regions. The first, third and fifth catalyst regions include upper surfaces higher than those of the second and fourth catalyst regions. Adjacent ones of the first to fifth catalyst regions are in contact with each other. A distance between the first and the third catalyst region and a distance between the third and fifth catalyst region are greater than a mean free path of graphene. The graphene layer includes a first graphene layer on the second catalyst region and a second graphene layer on the fourth catalyst region.

14 Claims, 19 Drawing Sheets

(58) Field of Classification Search
USPC .......................................................... 257/750
See application file for complete search history.

(56) References Cited

U.S. PATENT DOCUMENTS

| | | | | |
|---|---|---|---|---|
| 2010/0090265 | A1* | 4/2010 | Bhattacharyya | B82Y 10/00 257/315 |
| 2011/0006425 | A1* | 1/2011 | Wada | H01L 21/76807 257/750 |
| 2011/0009679 | A1* | 1/2011 | Rappe | B01J 23/628 585/16 |
| 2011/0308717 | A1* | 12/2011 | Cho | B32B 37/025 156/249 |
| 2012/0068160 | A1* | 3/2012 | Yamazaki | B82Y 10/00 257/29 |
| 2012/0256167 | A1* | 10/2012 | Heo | H01L 29/1606 257/27 |
| 2013/0134592 | A1 | 5/2013 | Yamazaki et al. | |
| 2013/0161587 | A1* | 6/2013 | Xianyu | H01L 29/66742 257/29 |
| 2013/0249093 | A1 | 9/2013 | Yamazaki et al. | |
| 2013/0285213 | A1* | 10/2013 | Wei | H01L 29/06 257/618 |
| 2013/0285970 | A1* | 10/2013 | Ahn | G06F 3/044 345/173 |
| 2014/0014905 | A1* | 1/2014 | Lee | H01L 29/78 257/29 |
| 2014/0167268 | A1* | 6/2014 | Bao | H01L 23/53276 257/761 |
| 2014/0284303 | A1* | 9/2014 | Kim | B82Y 30/00 216/13 |
| 2014/0299975 | A1* | 10/2014 | Cho | H01L 21/02664 257/629 |
| 2014/0339506 | A1* | 11/2014 | Dimitrakopoulos | H01L 29/1606 257/29 |
| 2015/0241908 | A1* | 8/2015 | Ozyilmaz | H01L 41/193 345/174 |
| 2015/0348666 | A1* | 12/2015 | Na | B32B 9/007 252/510 |

* cited by examiner

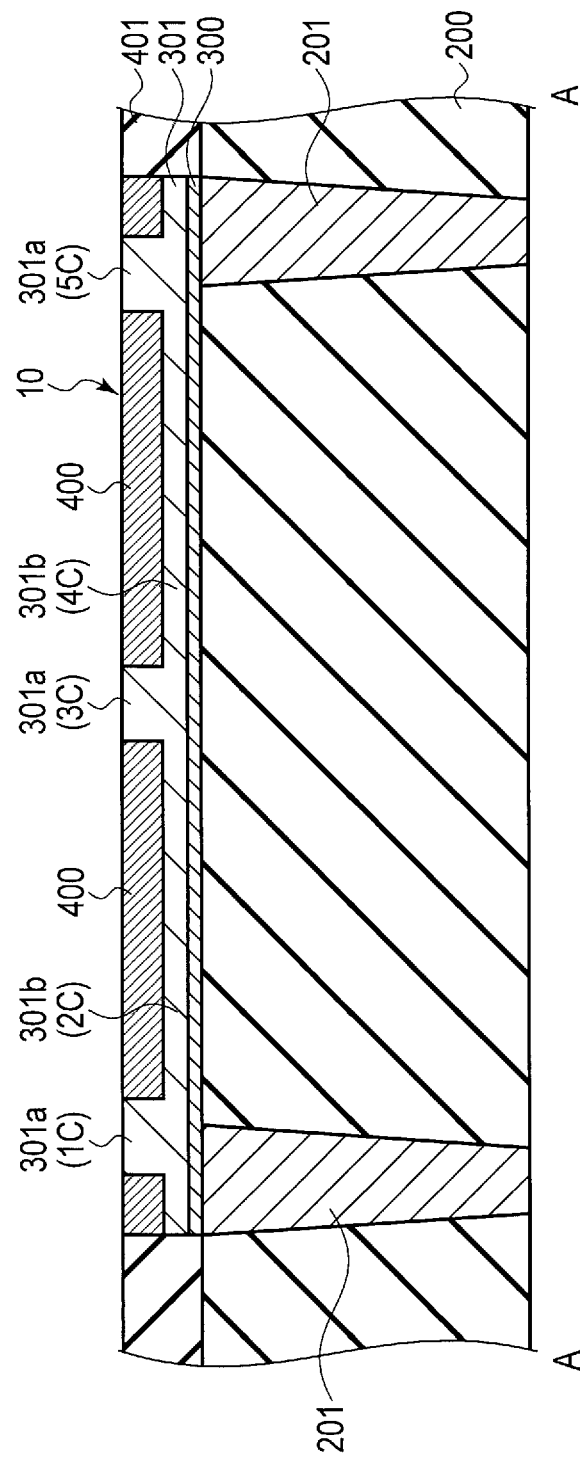
F I G. 2A

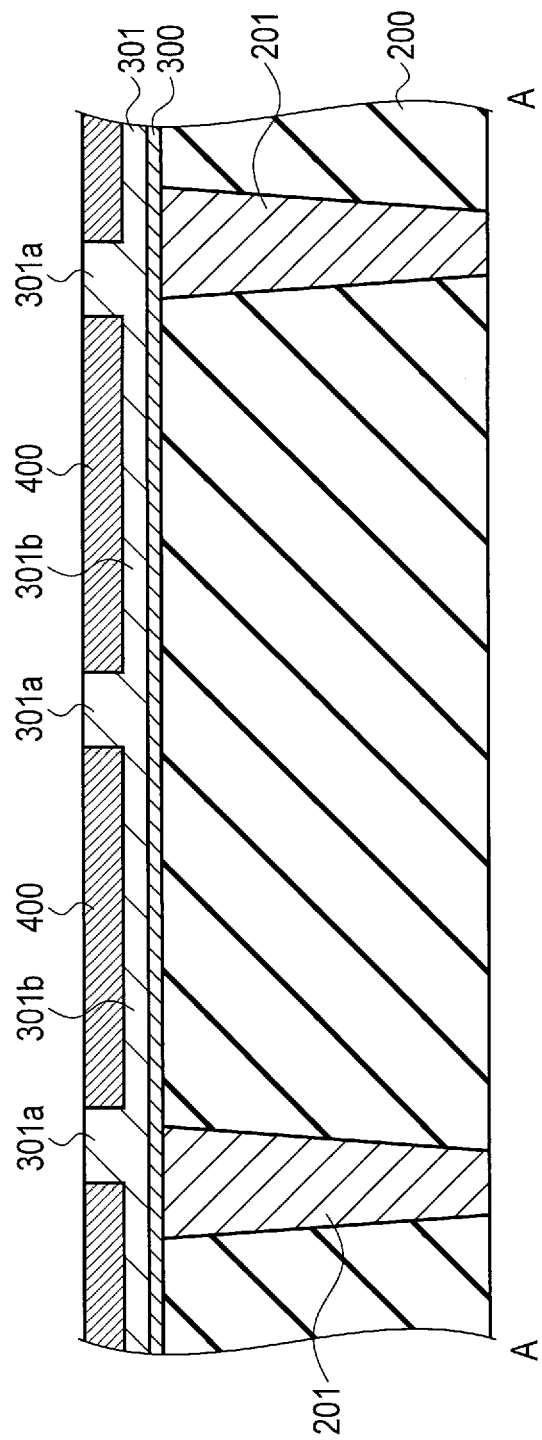
F I G. 10A

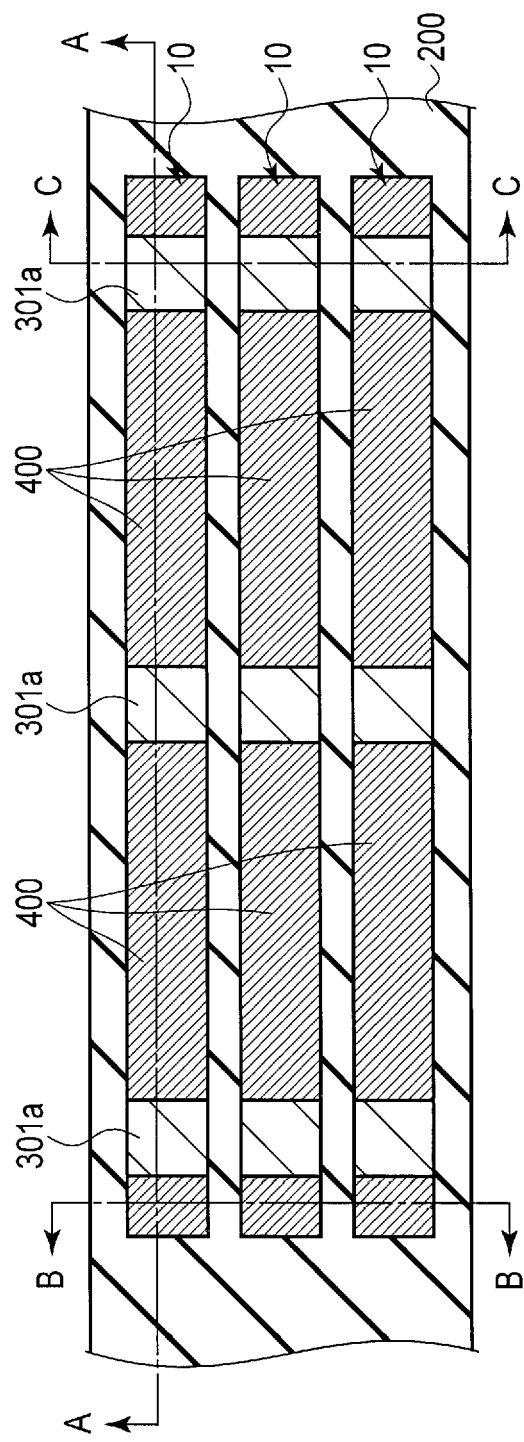
F I G. 11

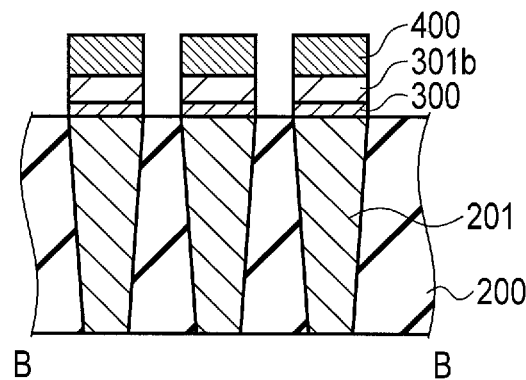
F I G. 12B
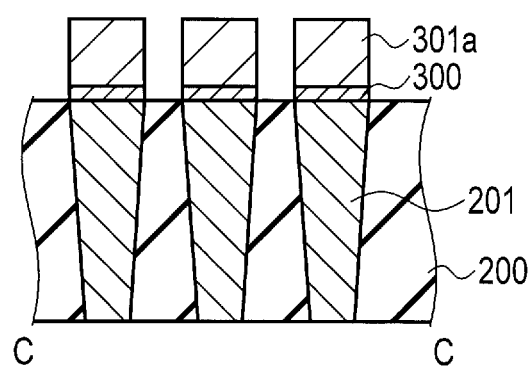
F I G. 12C

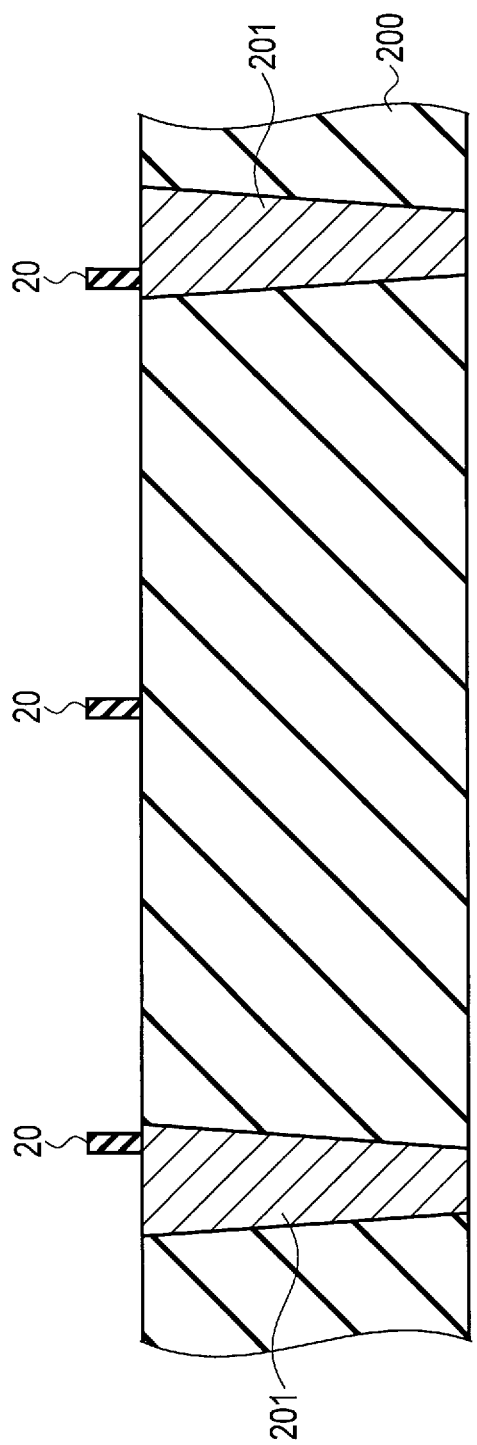
F I G. 15A

SEMICONDUCTOR DEVICE AND METHOD OF MANUFACTURING THE SAME

CROSS-REFERENCE TO RELATED APPLICATIONS

This application is based upon and claims the benefit of priority from Japanese Patent Application No. 2015-051162, filed Mar. 13, 2015, the entire contents of which are incorporated herein by reference.

FIELD

Embodiments described herein relate generally to a semiconductor device including a graphene layer and a method of manufacturing the same.

BACKGROUND

In recent years, the miniaturization of a wiring has advanced in an LSI wiring structure, which arises a problem such as an increasing of electric resistivity caused by interfacial inelastic scattering of electrons, an increasing of current density, or a reliability degradation by stress migration or electro-migration. Copper having a low-resistance metal is mainly used as a wiring material for LSI, however the problem still arises with the advance of microfabrication of the wiring structure.

Then, it is examined to use graphene as the wiring material for LSI. It is well known that quantized conductance (what is called Ballistic conductance) is generated in the graphene, and the graphene is expected to be an extremely low resistance material as an alternative to the existing metallic materials.

BRIEF DESCRIPTION OF THE DRAWINGS

FIG. 2A is a sectional view along line A-A in FIG. 1.

FIG. 10A is a sectional view along line A-A in FIG. 9.
FIG. 11 is a plan view for explaining the method of manufacturing the semiconductor device according to the embodiment subsequently to FIG. 9.

FIG. 12B is a sectional view along line B-B in FIG. 11.
FIG. 12C is a sectional view along line C-C in FIG. 11.

FIG. 15A is a sectional view for explaining a method of manufacturing a semiconductor device according to another embodiment.

DETAILED DESCRIPTION

Figure 1:
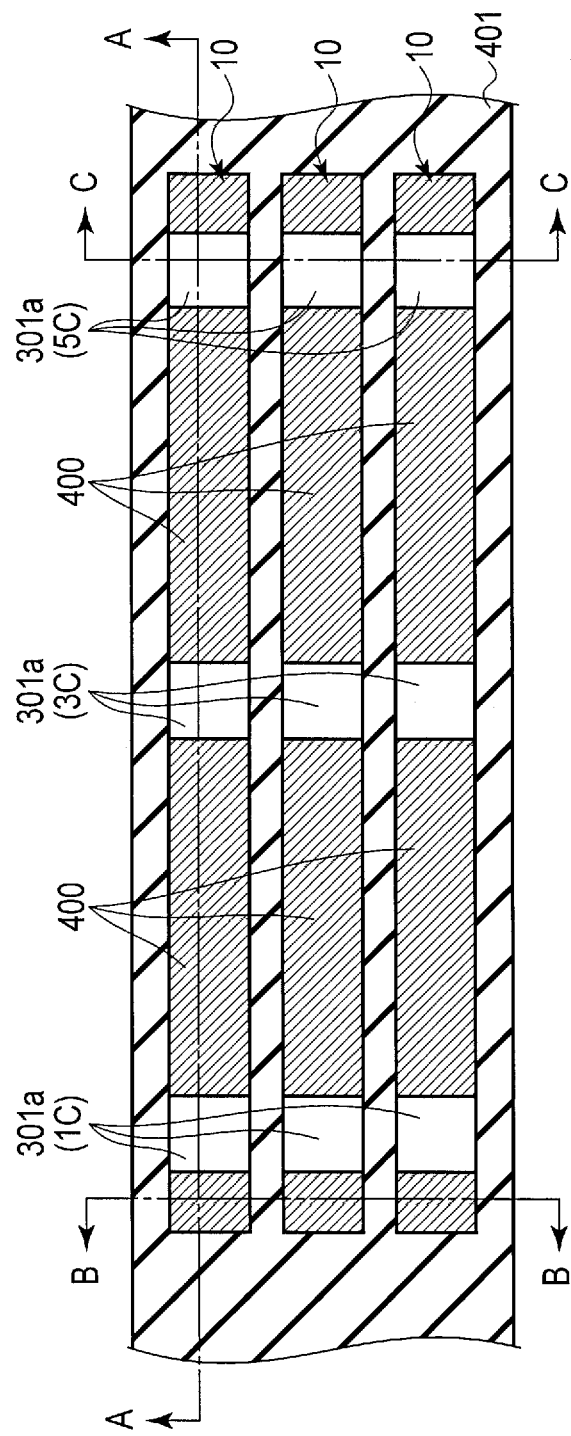
FIG. 1 is a plan view illustrating a semiconductor device according to an embodiment.

In general, according to one embodiment, a semiconductor device is disclosed. The device includes a substrate; and one or a plurality of interconnects provided on the substrate. Each of the one or a plurality of interconnects includes a catalyst layer and a graphene layer provided on the catalyst layer. The catalyst layer includes a first catalyst region, a second catalyst region, a third catalyst region, a fourth catalyst region and a fifth catalyst region which are arranged along a first direction in order of the first, second, third, fourth and fifth catalyst regions. The first, third, and fifth catalyst regions include upper surfaces higher than those of the second and fourth catalyst regions. Adjacent ones of the first, second, third, fourth, and fifth catalyst regions are in contact with each other. A distance between the first catalyst region and the third catalyst region, and a distance between the third catalyst region and fifth catalyst region are greater than a mean free path of graphene. The graphene layer includes a first graphene layer provided on the second catalyst region, and a second graphene layer provided on the fourth catalyst region.

According to an embodiment, a method of manufacturing a semiconductor device is disclosed. The method includes forming a catalyst layer on a substrate; forming a first catalyst region, a second catalyst region, a third catalyst region, a fourth catalyst region, and a fifth catalyst region by processing the catalyst layer. The first, second, third, fourth, and fifth catalyst regions are arranged along a first direction in order of the first, second, third, fourth, and fifth catalyst regions. The first, third, and fifth catalyst regions include upper surfaces higher than those of the second and fourth catalyst regions. Adjacent ones of the first, second, third, fourth, and fifth catalyst regions are in contact with each other. A distance between the first and third catalyst regions, and a distance between the third and fifth catalyst region are greater than a mean free path of graphene. The method further includes forming a graphene layers on the second and fourth catalyst regions by growing graphene using the first, third, and fifth catalyst regions as starting points of growth; and forming one or plurality of interconnects by processing the graphene layer and the catalyst layer, wherein the one or plurality of the interconnects extend along the first direction.

Hereafter, embodiments of the present invention will be described, referring to the drawings, which illustrate typical or conceptual examples. A size, a ratio, etc. of each drawing are not necessarily the same as those of an actual embodiment. Moreover, in any of the drawings, the same symbols indicate the same or corresponding portions. Explanation will be repetitiously given if needed.

Figure 2B:
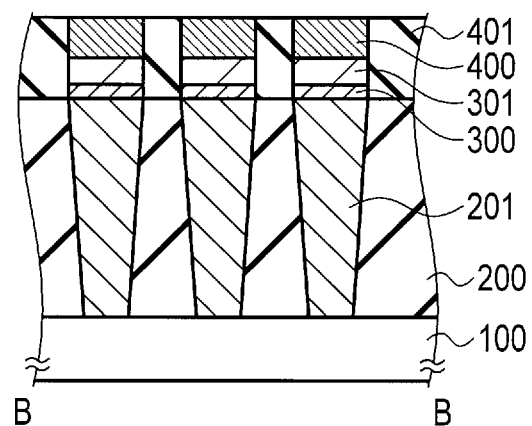
FIG. 2B is a sectional view along line B-B in FIG. 1.
Figure 2C:
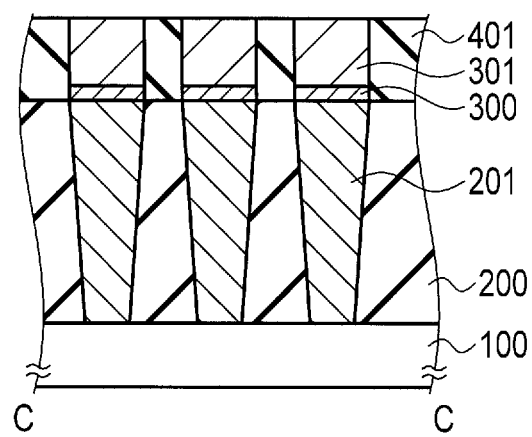
FIG. 2C is a sectional view along line C-C in FIG. 1.

FIG. 1 illustrates a plan view of a semiconductor device in an embodiment. FIG. 2A illustrates a sectional view along line A-A in FIG. 1, FIG. 2B a sectional view along line B-B in FIG. 1, and FIG. 2C a sectional view along line C-C in FIG. 1.

The semiconductor device of the present embodiment comprises an interconnect (a graphene interconnect) 10 including a graphene layer 400. FIG. 1 illustrates three linear graphene interconnects 10. These graphene interconnects 10 are arranged in a direction (second direction) different from a longitudinal direction of the interconnections (first direction), here, in a perpendicular direction to the longitudinal direction.

Each graphene interconnect 10 includes a catalyst foundation layer 300, a catalyst layer 301 provided on the catalyst foundation layer 300, and a graphene layer 400 provided on the catalyst layer 301.

The catalyst layer 301 has a structure in which the convex shape catalyst regions 301a and the recess shape catalyst regions 301b are alternately arranged. FIG. 2A successively illustrates from left to right a first convex shape catalyst region 301a (hereinafter also referred to as a first catalyst region 1C), a first recess shape catalyst region 301b (hereinafter also referred to as a second catalyst region 2C), a second convex shape catalyst region 301a (hereinafter also referred to as a third catalyst region 3C), a second recess shape catalyst region 301b (hereinafter also referred to as a fourth catalyst region 4C), and a third convex shape catalyst region 301a (hereinafter also referred to as a fifth catalyst region 5C).

The Catalyst regions 1C-5C are arranged along the first direction. The catalyst regions 1C, 3C, and 5C are thicker than the catalyst regions 2C and 4C, and comprise upper surfaces higher than those of the catalyst regions 2C and 4C. The catalyst regions 10, 3C, and 5C are higher in upper surface than catalyst regions 2C and 4C. Adjacent ones of the first to the fifth catalyst region are in contact with each other. Moreover, a distance between the catalyst regions 10 and 3C and a distance between the catalyst regions 3C and 5C are greater than a mean free path of graphene.

In the plurality of graphene interconnects 10, as shown in FIG. 1, the plurality of catalyst regions 10 are arranged along a first line (not shown) parallel to the second direction, the plurality of catalyst regions 3C are arranged along a second line (not shown) parallel to the second direction and different from the first line, and the plurality of catalyst regions 5C are arranged along a third line (not shown) parallel to the second direction and different from the first and second lines.

The graphene layers 400 are provided on the recess shape catalyst regions 301b, and connects adjacent two the convex shape catalyst regions 301a. The graphene interconnects 10 has a structure in which the plurality of graphene layer 400 are connected in series via the convex shape catalyst regions 301a.

FIG. 2A shows an example that the upper surface of the graphene layer 400 and the upper surface of the convex shape catalyst regions 301a are same in height, but the upper surface of the graphene layer 400 may be lower than the upper surface of the convex shape catalyst regions 301a. Conversely, the upper surface of the graphene layer 400 may be higher than the upper surface of the convex shape catalyst regions 301a.

In the present embodiment, each of the graphene interconnects 10 connects the upper surfaces of two contact plugs 201, as shown in FIG. 2A. The lower surfaces of the contact plugs 201 are connected to the substrate 100.

Hereafter, the semiconductor device of the present embodiment will be further explained according to its manufacturing method.

Figure 3:
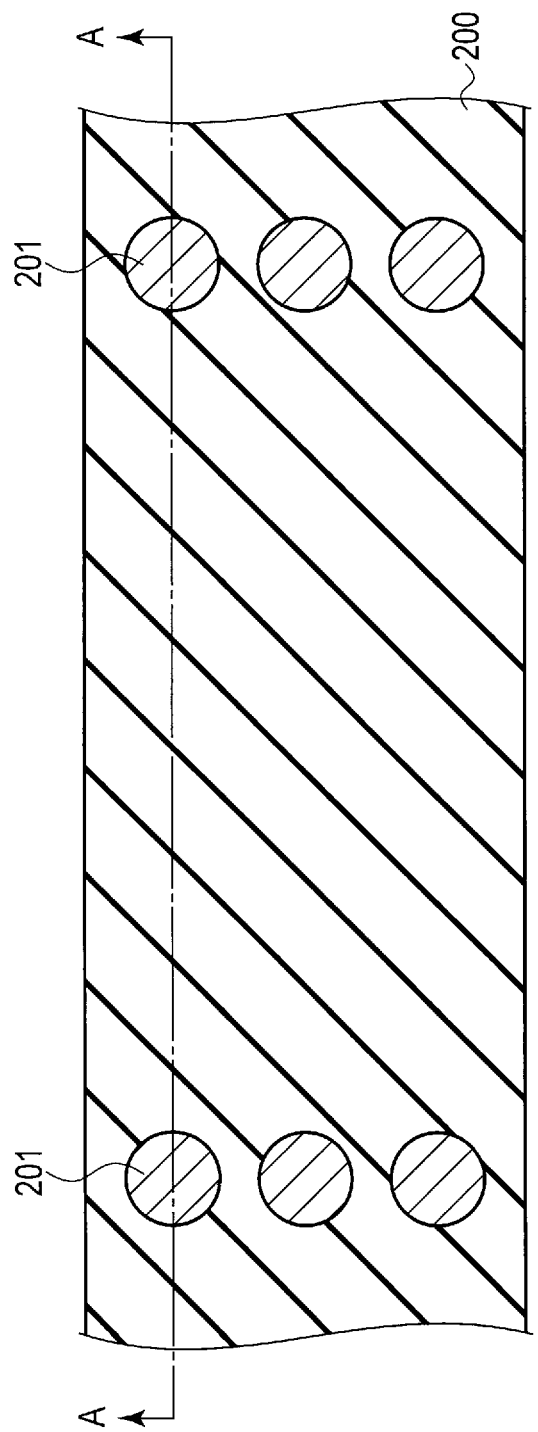
FIG. 3 is a plan view for explaining a method of manufacturing a semiconductor device according to an embodiment.
Figure 4:
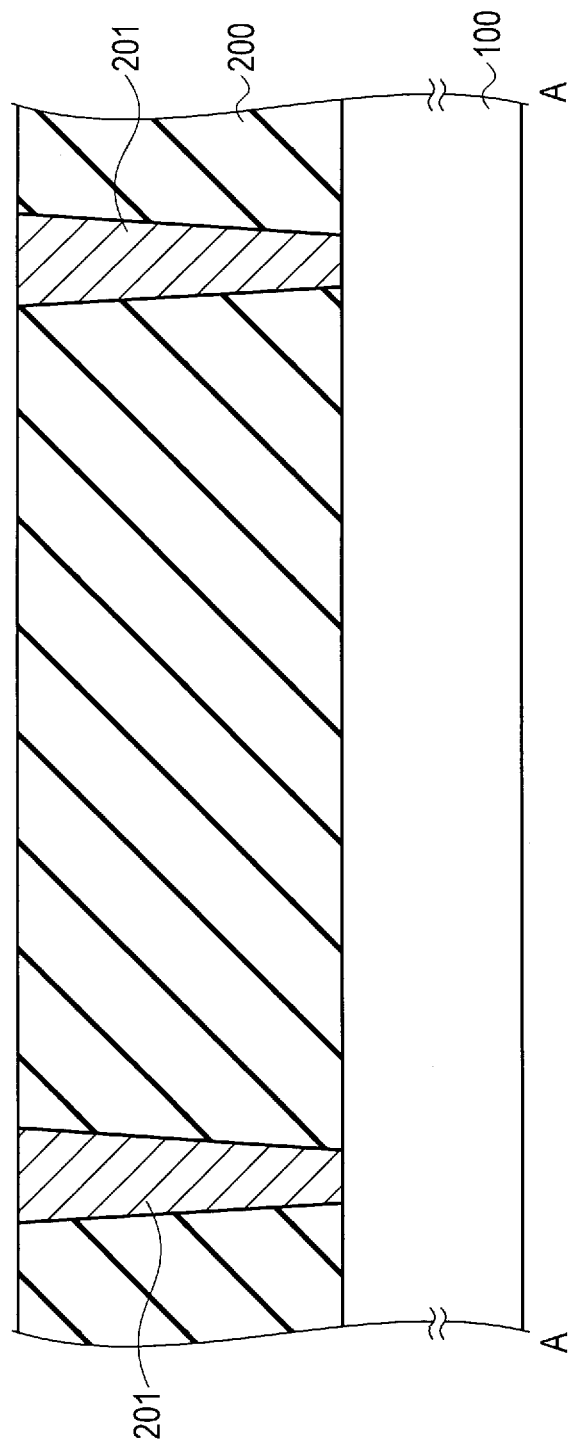
FIG. 4 is a sectional view along line A-A in FIG. 3.

[FIG. 3 and FIG. 4]

An interlayer insulation film 200 is formed on a substrate 100. The substrate 100 includes a semiconductor substrate, such as a silicon substrate, for example. Elements, such as a MOS transistor, a capacitor, etc., are formed on the semiconductor substrate. The substrate 100 may further include interconnects provided on the semiconductor substrate. The interconnects have damascene structures, for example.

Thereafter, contact plugs 201 are formed, which penetrate the interlayer insulation film 200 and are connected to the substrate 100 are formed. The lower surfaces of the contact plugs 201 are connected to, for example, the source or drain regions of MOS transistors (not shown) in the substrate 100, or interconnects (not shown). The material of the contact plugs 201 is Cu, Al, W, or an alloy including one of them, for example.

Moreover, in order to prevent diffusion of material (for example, Cu) in the contact plugs 201 into the interlayer insulation film 200, the contact plugs 201 may be covered with barrier metallic films.

Moreover, upper surfaces of the interlayer insulation film 200 and the contact plugs 201 are planarized. This planarization is performed by chemical mechanical polishing (CMP) process, for example.

Figure 5:
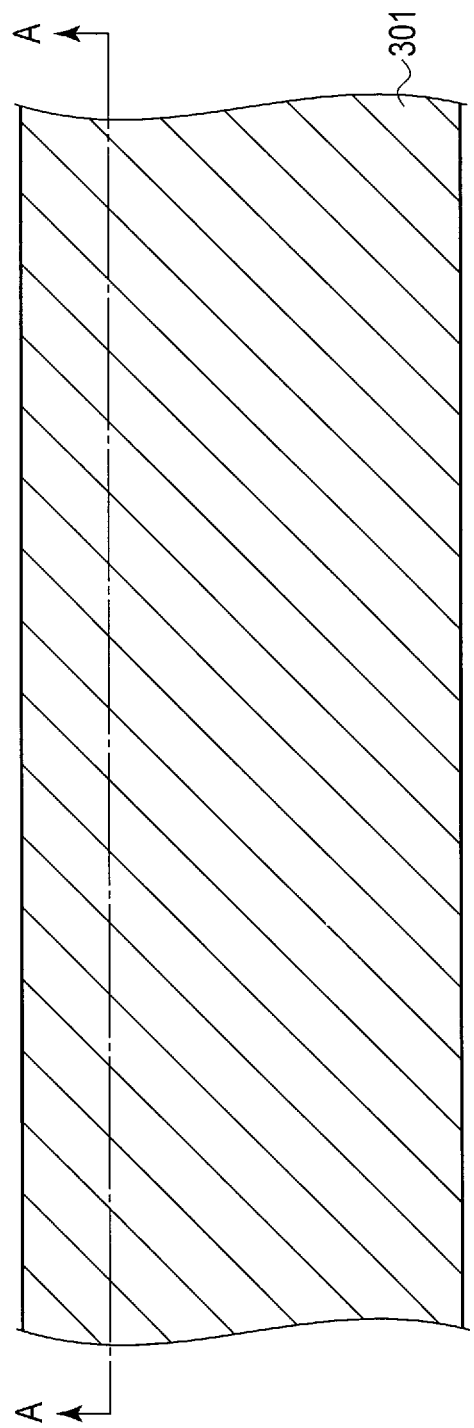
FIG. 5 is a plan view for explaining the method of manufacturing the semiconductor device according to the embodiment subsequently to FIG. 3.
Figure 6:
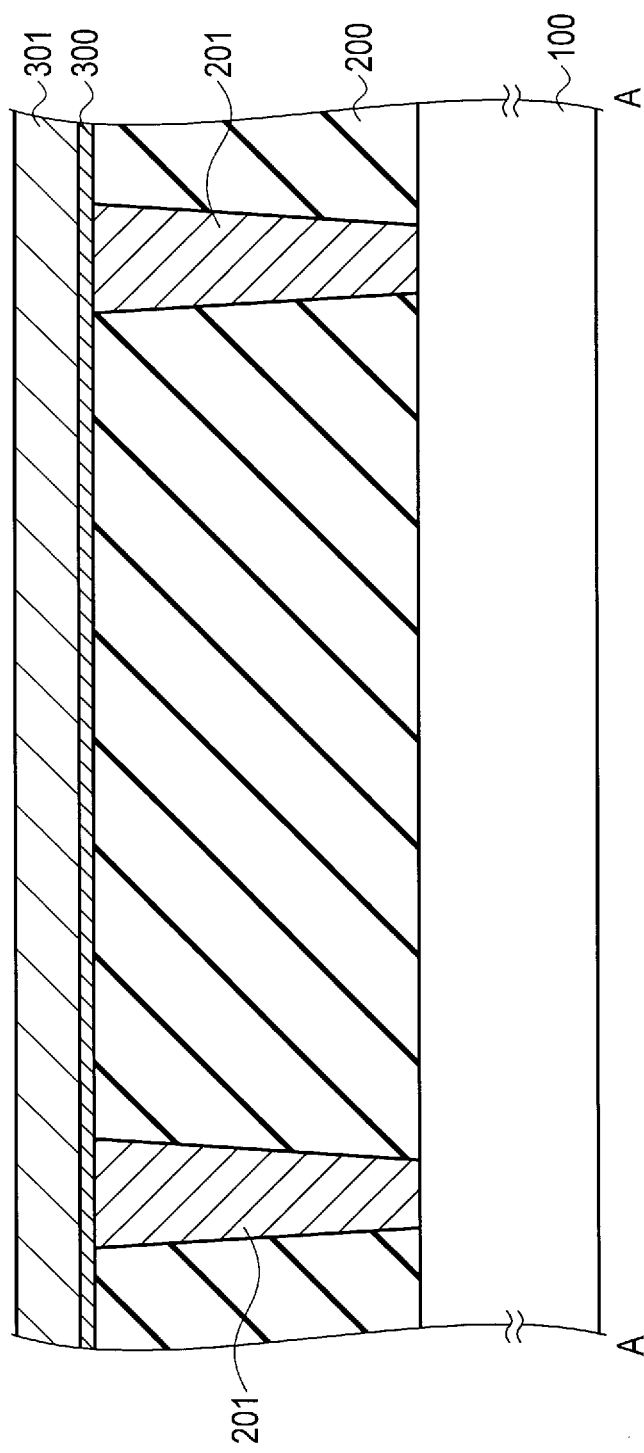
FIG. 6 is a sectional view along line A-A in FIG. 5.

[FIG. 5 and FIG. 6]

A catalyst foundation layer 300 is formed on the upper surfaces of the interlayer insulation film 200 and the contact plugs 201. The material of the catalyst foundation layer 300 is Ta, Ti, Ru, W, Al, or their nitrides or oxides, for example. The catalyst foundation layer 300 is a single layer film or a laminated layer film containing any of the mentioned materials. It is possible to omit the catalyst foundation layer 300.

A catalyst layer 301 is formed on the catalyst foundation layer 300. The catalyst layer 301 is connected to the contact plugs 201 via the catalyst foundation layer 300. Therefore, in the present embodiment, the catalyst layer 301 is connected to the substrate 100 via the catalyst foundation layer 300 and the contact plugs 201.

The material of the catalyst layer 301 is Co, Ni, Fe, Cu, Ru, or their alloys or carbides, for example. The catalyst layer 301 is a single layer film or a laminated layer film containing any of the materials. When the catalyst layer 301 disperses to be in a particulate state, graphene will not grow successfully or a graphene layer may be formed discontinuously. Therefore, it is desirable that the catalyst layer 301 is a continuous film. In order for the catalyst layer 301 to have a form of a continuous film, the thickness of the catalyst layer 301 shall be 0.5 nm or more, for example.

Figure 7:
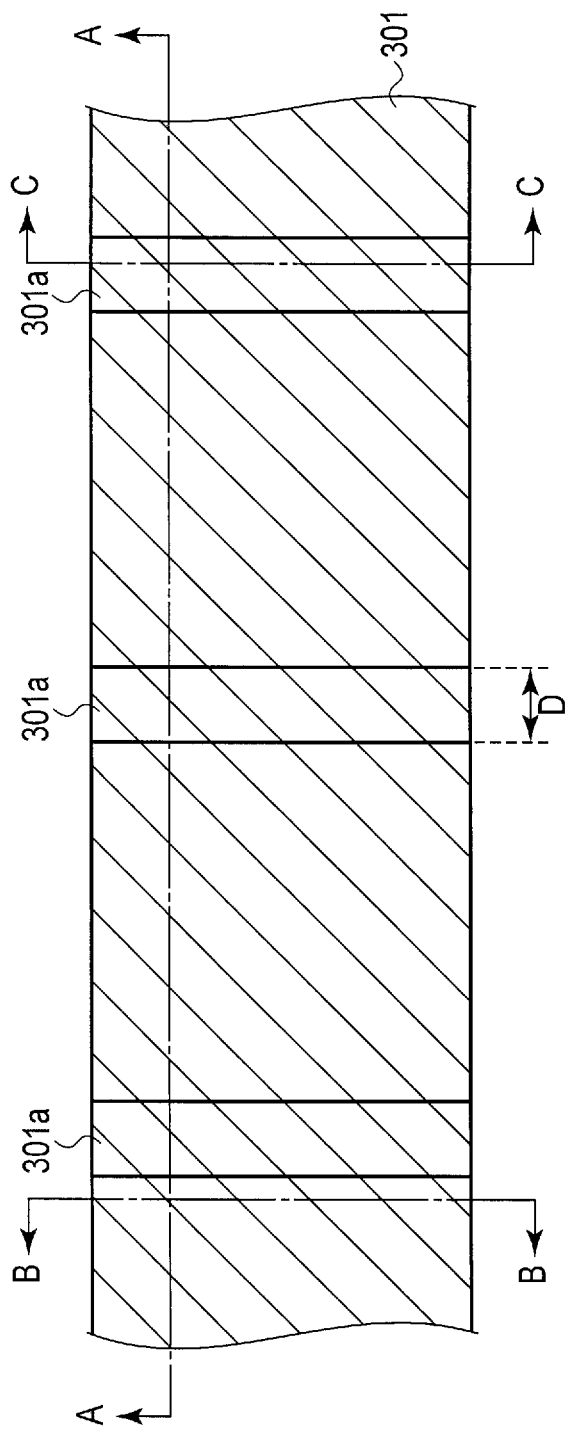
FIG. 7 is a plan view for explaining the method of manufacturing the semiconductor device according to the embodiment subsequently to FIG. 5.
Figure 8:
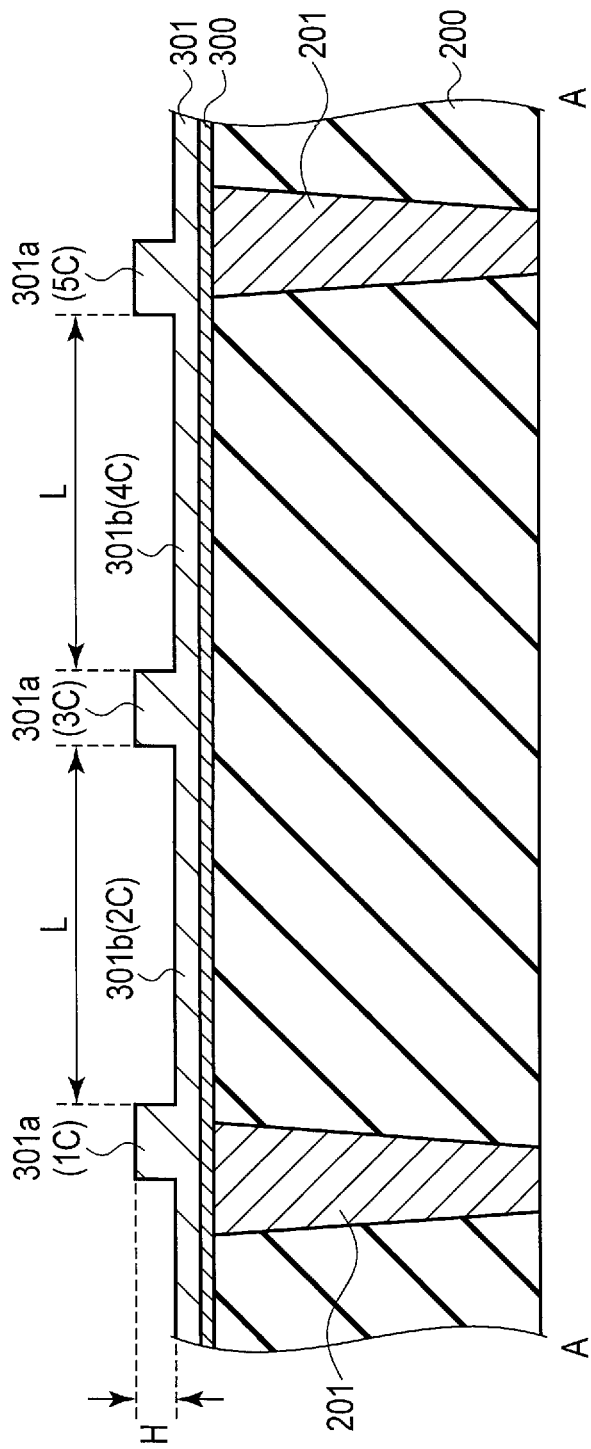
FIG. 8 is a sectional view along line A-A in FIG. 7.

[FIG. 7 and FIG. 8]

The surface of the catalyst layer 301 is partially thinned using photolithography process and etching process to form the plurality of convex shape catalyst regions 301a, 301b on the catalyst layer 301. The etching process is a reactive ion etching (RIE) process, for example.

The distance L between adjacent two convex shape catalyst regions 301a, i.e., the distance L1 between the first and third catalyst regions 10, 3C, and between the third and fifth catalyst regions 3C, 5C is greater than the mean free path of graphene, for example, 0.1 μm or more, preferably 1 μm or more.

In the present embodiment, the distance L between the first and third catalyst regions 10, 3C is the same as the distance L between the third and fifth catalyst regions 3C, 5C, but both the distances may be different as long as the distance are greater than the mean free path of graphene.

In addition, the catalyst regions 301a have higher resistance than the graphene layers formed on the catalyst regions 301b. Therefore, in a point of reducing interconnect resistance, a dimension D of the catalyst region 301a in the longitudinal direction of the interconnect is preferred to be small, for example, the dimension D is 100 nm or less. Even the graphene layer (not show) is formed on the catalyst regions 301a, the influence of graphene layer for increasing the interconnect resistance is small, since the dimension of longitudinal direction of the graphene layer is small corresponding to that the dimension D is small.

Furthermore, in reducing the interconnect resistance, it is desirable that the ratio of the first catalyst region 301a in the interconnect is small, for example, the ratio of D/L is 1/10 or less.

The height H of the convex shape catalyst region 301a is determined according to the height of the graphene layer, for example, the height H is 100 nm or less (for example, 20 nm). More specifically, the height H is not less than 5 nm and not more than 50 nm, for example.

[FIG. 9, FIG. 10A, FIG. 10B and FIG. 10C]

The continuous graphene layer 400 without a break, which fills concave portions between the adjacent ones of the catalyst regions 301a, is easily formed by growing graphene at low temperature (650° C. or less (lower limit is, for example, 300° C.)) by low temperature chemical vapor deposition (CVD) process using a source gas containing carbon.

The mechanism of forming the graphene layer 400 is considered as follows.

In the temperature CVD process, side surfaces of the catalyst regions 301a act as growth starting points of graphene. While the CVD process is performed, the carbon in the source gas is supplied to the side surfaces of the catalyst regions 301a. As a result, graphene grows continuously using the side surfaces of the catalyst regions 301a as growth starting points, and the continuous graphene layer 400 without a break is obtained. That is, the graphene layer 400 having the length greater than the mean free path of graphene can be easily formed.

It is noted that graphene includes at least one of a single-layer graphene and a stacked layer of single-layer graphenes (stacked graphene). In addition, a graphene layer is a layer including graphene.

[FIG. 11, FIG. 12A, FIG. 12B and FIG. 12C]

The catalyst foundation layer 300, the catalyst layer 301, and the graphene layer 400 are successively patterned using photolithography process and etching process to form the graphene interconnects 10 which include a divided catalyst foundation layer 300, catalyst layer 301, and graphene layer 400.

Figure 9:
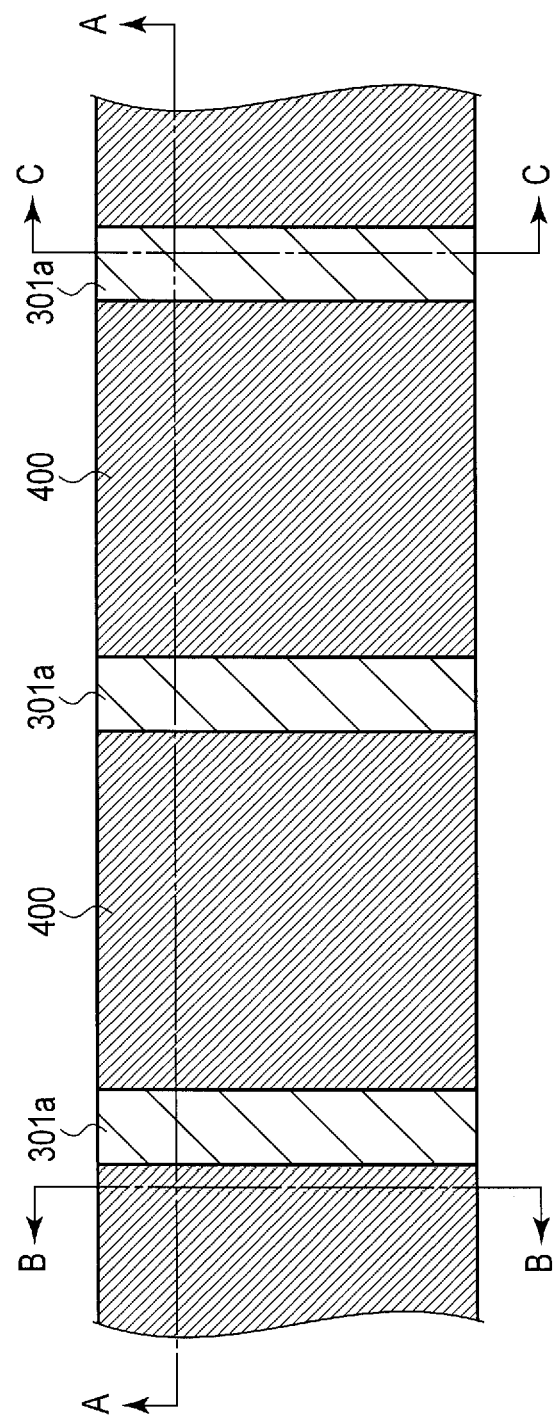
FIG. 9 is a plan view for explaining the method of manufacturing the semiconductor device according to the embodiment subsequently to FIG. 7.
Figure 10B:
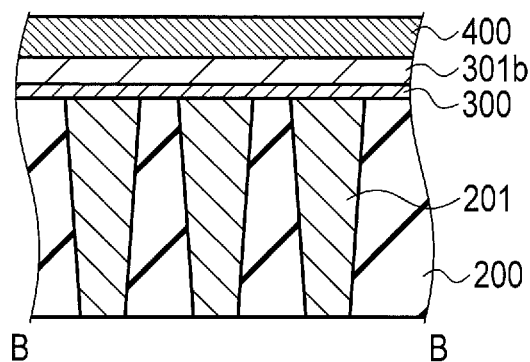
FIG. 10B is a sectional view along line B-B in FIG. 9.
Figure 10C:
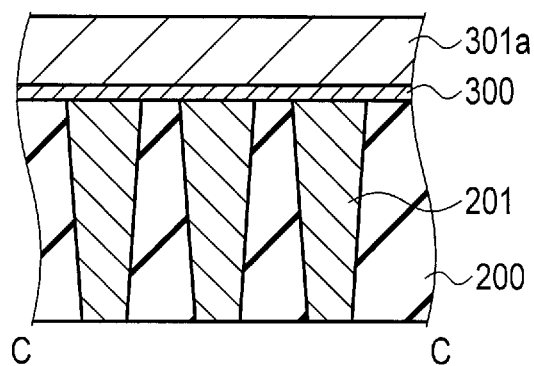
FIG. 10C is a sectional view along line C-C in FIG. 9.
Figure 12A:
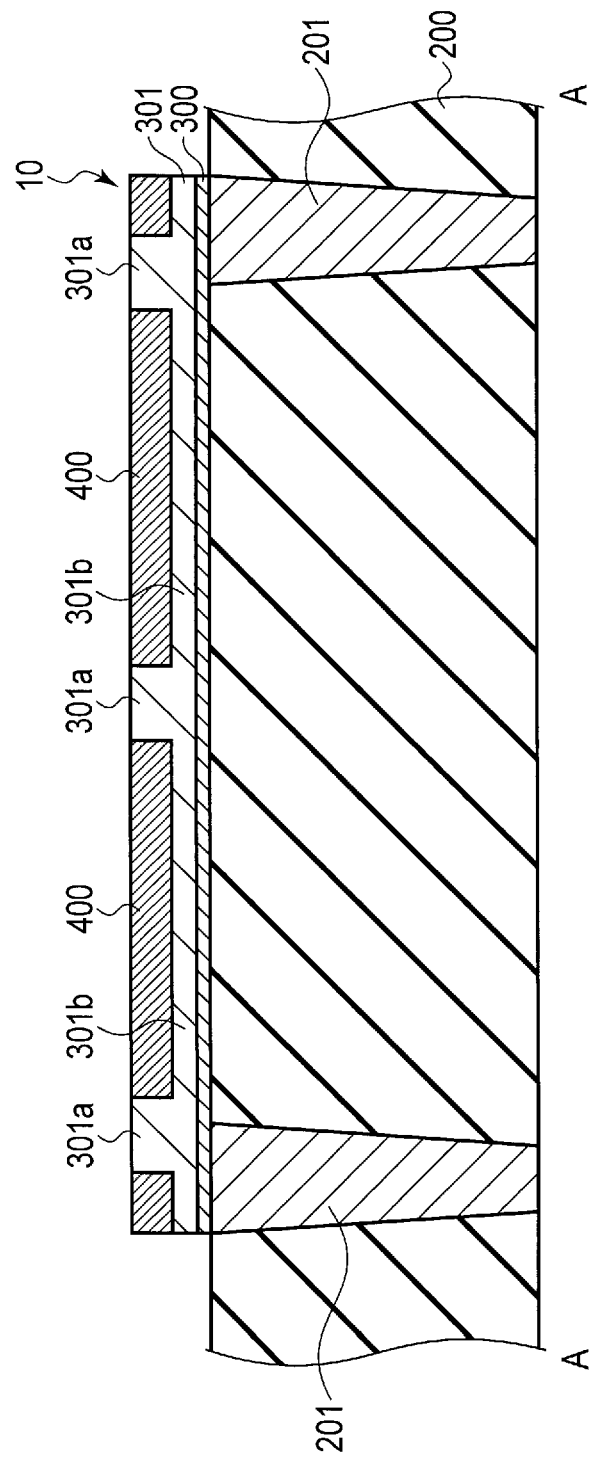
FIG. 12A is a sectional view along line A-A in FIG. 11.

In the present embodiment, the catalyst foundation layer 300, the catalyst layer 301, and the graphene layer 400 are divided (patterned) into a plurality of linear pieces (three pieces in the figures) such that the longitudinal directions of the graphene interconnect 10 is to be perpendicular to the longitudinal direction of the catalyst regions 301a shown in FIG. 9.

As mentioned above, the graphene interconnect 10 has the structure in which the plurality of graphene layer 400 (with the width greater than the mean free path of graphene) are connected in series via the catalyst regions 301a. Therefore, the graphene interconnect 10 can be easily lengthened. In addition, a graphene layer having a width with a predetermined value or less represents a constant resistance regardless of the width owing to a quantum effect, so that the graphene interconnect 10 may have the width with the predetermined value or less. From the above, the graphene interconnect 10 can be used for a thin bit line with a length of mm order, which is used for a memory cell section in a memory device, for example.

A portion of the catalyst foundation layer 300, a portion of the catalyst layer 301, and a portion of the graphene layer 400 are removed by the above etching process, and surfaces of the interlayer insulation film 200 under the removed portions are exposed.

Thereafter, an interlayer insulation film 401 is formed on the interlayer insulation film 200, the graphene layer 400, and the catalyst layer 301, and a surface of the interlayer insulation film 401 is planarized by CMP process, thereby obtaining the semiconductor device having the structure shown in FIG. 1, FIG. 2A, FIG. 2B, and FIG. 2C.

Figure 13:
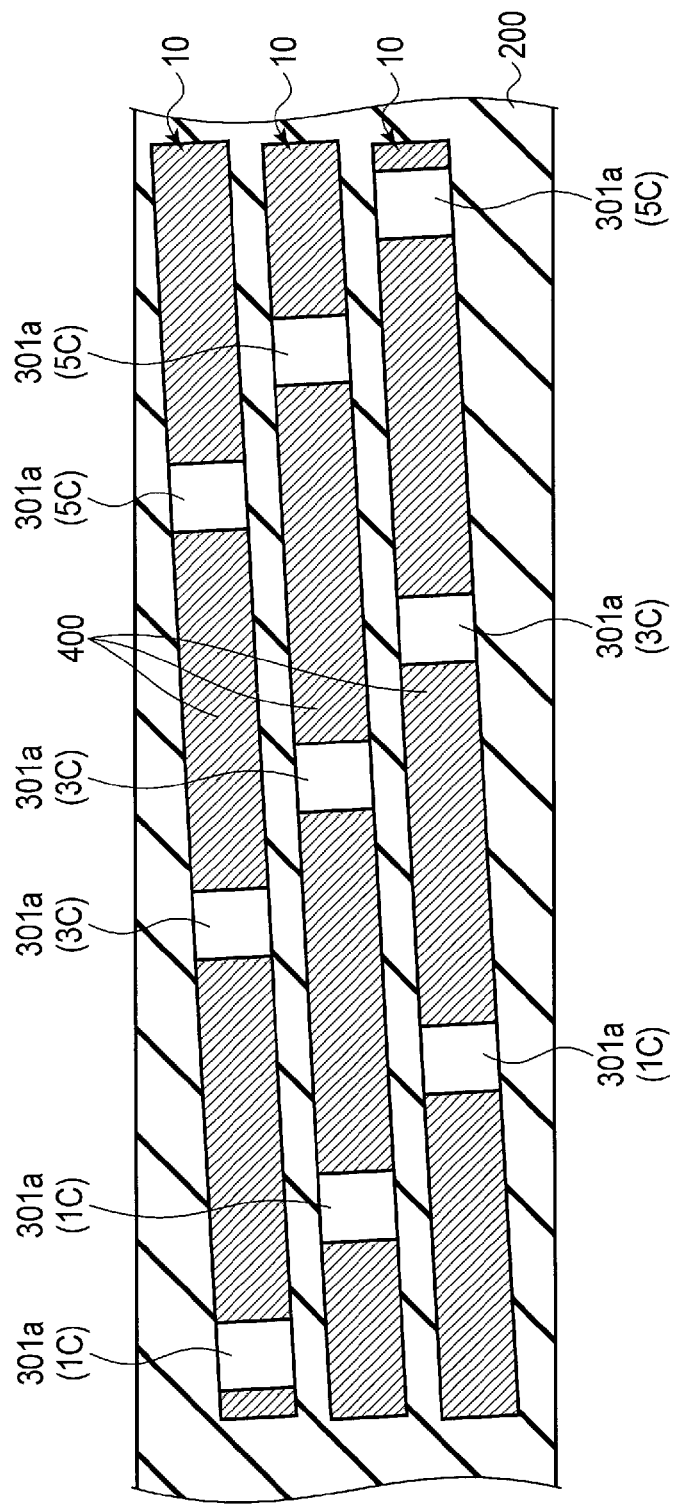
FIG. 13 is a plan view schematically illustrating a semiconductor device according to another embodiment.

In addition, as shown in FIG. 13, in the plurality of graphene interconnects 10, a plurality of catalyst regions 1C may be arranged along a first straight line (not shown) that is nonparallel to the first and the second directions, a plurality of catalyst regions 3C may be arranged along a second straight line (not shown) that is different from the first straight line and nonparallel to the first and the second directions, and a plurality of catalyst regions 5C may be arranged along a third straight line (not shown) that is different from the first and second straight lines and nonparallel to the first and the second directions.

In other words, the graphene interconnects 10 may be formed by patterning the catalyst foundation layer 300, the catalyst layer 301, and the graphene layer 400 so that the longitudinal directions of graphene interconnects 10 are not to be perpendicular to the longitudinal directions of the convex shape catalyst regions 301a in FIG. 9.

It is noted that the impurities may be introduced into the catalyst regions 301a to increase the number of free electrons in the catalyst regions 301a. The interconnect resistance can be reduced by increasing the number of the free electrons since the catalyst regions 301a constitutes a part of the graphene interconnect.

The introduction of impurities is performed using ion implantation process, for example. There is not particular limitation on the timing of introducing the impurities into the catalyst regions 301a as long as the surface of the catalyst regions 301a is exposed.

Moreover, the impurities may be introduced into the catalyst layer 301 before the catalyst regions 301a are formed. That is, in addition to the catalyst regions 301a, the impurities may be introduced into the catalyst layer 301. In this case, the impurities may be introduced in the middle of forming the catalyst layer 301, or the impurities may be introduced after the catalyst layer 301 is formed.

Figure 14:
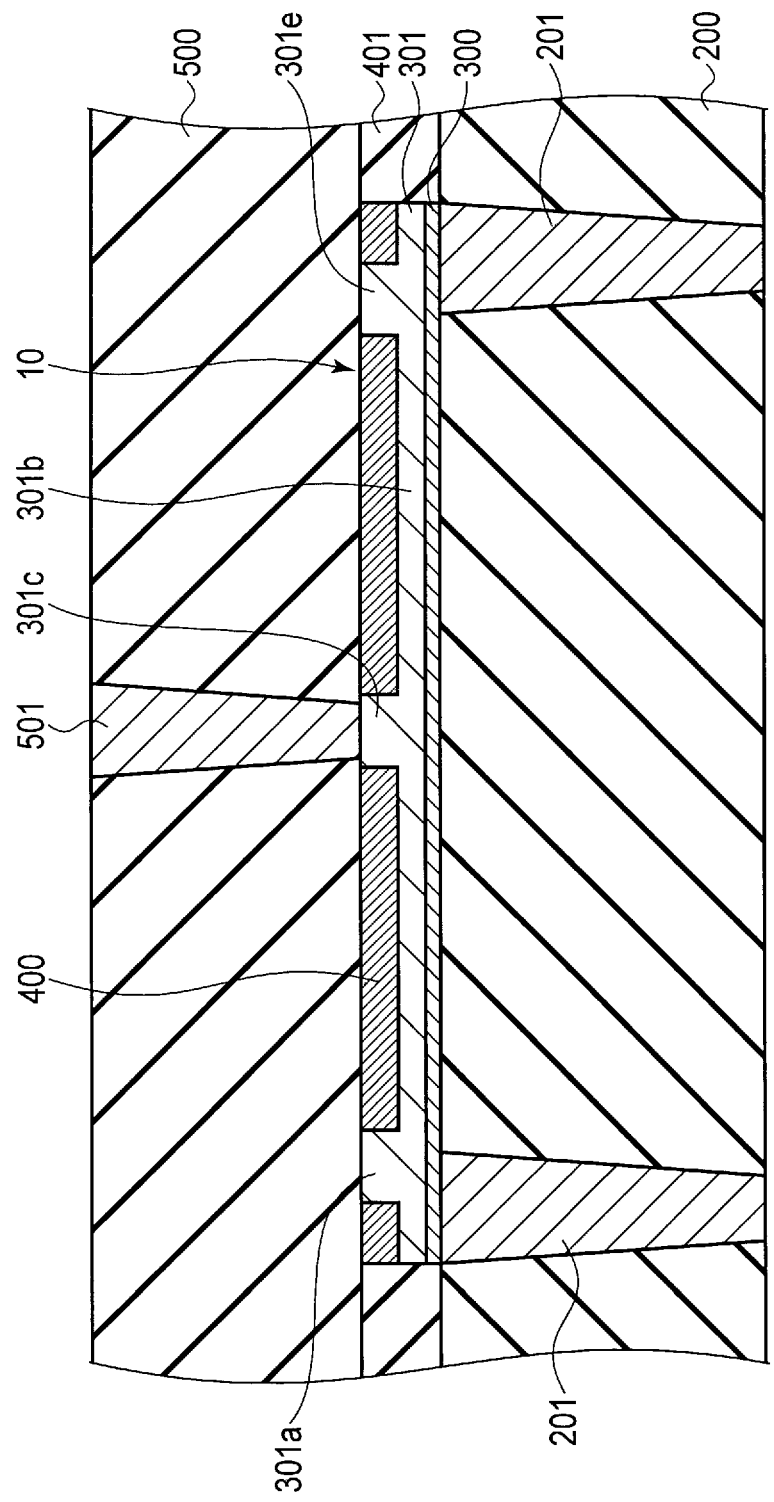
FIG. 14 is a sectional view schematically illustrating a graphene interconnect and contact plugs connected to the graphene interconnect according to an embodiment.

Moreover, FIG. 14 is a sectional view illustrating an example of a contact structure formed on the graphene interconnect 10 and including a contact plug 501.

The contact plug 501 penetrates through an interlayer insulation film 500 formed on the graphene interconnects 10, and is connected to the graphene interconnects 10. More specifically, the contact plug 501 is connected to the upper surface of the convex shape catalyst regions 301a. That is, the contact plug 501 is not connected to the graphene layer 400. The reason is that a contact resistance between metal material used for the contact plug (for example, Al, W, Ti) and graphene is generally higher than a contact resistance between the metal material and catalyst material used for the catalyst layer.

It is noted that a refractory metal such as W is desirable as the metal material used for the contact plug 501, for example. The reason is that the refractory metal is generally easy to process. The contact plug 501 is formed by sputtering process using a sputtering target containing W, for example.

Figure 15B:
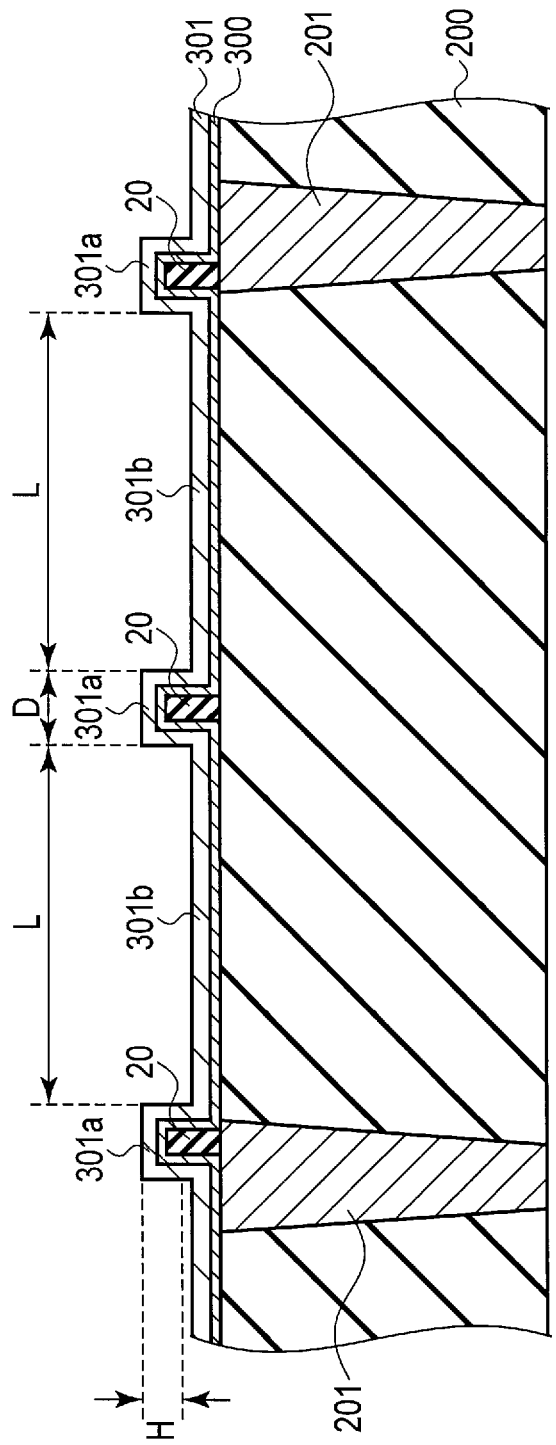
FIG. 15B is a sectional view for explaining the method of manufacturing the semiconductor device according to the embodiment subsequently to FIG. 15A.

FIG. 15A and FIG. 15B are sectional views for explaining another method of forming a catalyst layer 301 including first and second catalyst regions 301a, 301b.

First, as shown in FIG. 15A, convex patterns 20 are formed on regions corresponding to positions where the convex shape catalyst regions 301a are to be formed, using photolithography process and etching process. Material of the patterns 20 is, for example, insulating material such as silicon nitride. The patterns 20 are obtained, for example, by forming an insulating film, and patterning the insulating layer.

Next, as shown in FIG. 15B, the catalyst foundation layer 300 is formed on the entire surface (interlayer insulation film 200, contact plugs 201) to cover the patterns 20. Thereafter, the catalyst material is deposited on the catalyst foundation layer 300, thereby obtaining the catalyst layer 301 including the convex shape catalyst regions 301a and the recess shape catalyst regions 301b.

In this manner, the graphene interconnect in which the convex shape patterns 20 are provided under the convex shape catalyst regions 301a is obtained. In this graphene interconnect, the quantity of the catalyst material required to form the convex shape catalyst regions 301a can be reduced by an amount corresponding to the volume of the patterns 20.

The patterns 20 are determined to have a size and a shape in such a manner that the catalyst layer 301 has the above mentioned values for height H, distance L, and size D.

Alternatively, the catalyst layer 301 including the first and second catalyst regions 301a, 301b may be formed using nanoimprint process instead of using the photolithography process and the etching process. When the nanoimprint process is used, the convex shape catalyst regions 301a can be easily formed even in a case that the patterns have small D/L ratio (isolated pattern).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
a substrate; and
a first interconnect and a second interconnect provided on the substrate, each interconnect comprising a catalyst layer and first and second graphene layers provided on the catalyst layer,
the catalyst layer including a first catalyst region, a second catalyst region, a third catalyst region, a fourth catalyst region and a fifth catalyst region which are continuously arranged along a first direction in order of the first, second, third, fourth and fifth catalyst regions,
the first, third, and fifth catalyst regions comprising upper surfaces higher than upper surfaces of the second and fourth catalyst regions,
a distance between the first catalyst region and the third catalyst region, and a distance between the third catalyst region and fifth catalyst region being greater than or equal to 0.1 µm, and
the first graphene layer being provided on the second catalyst region, and the second graphene layer being provided on the fourth catalyst region,
wherein:
the catalyst layer of the second interconnect corresponds to the catalyst layer of the first interconnect,
the first and second graphene layers of the second interconnect correspond to the first and second graphene layers of the first interconnect, respectively, and
the first and second interconnects are arranged along a second direction different from the first direction.

2. The device according to claim 1, wherein:
the first catalyst regions of the first and second interconnects are arranged along a first line parallel to the second direction,
the third catalyst regions of the first and second interconnects are arranged along a second line parallel to the second direction, and the second line is different from the first line, and
the fifth catalyst regions of the first and second interconnects are arranged along a third line parallel to the second direction, and the third line is different from the first and second lines.

3. The device according to claim 1, wherein:
the first catalyst regions of the first and second interconnects are arranged along a first line non-parallel to the first and second directions,
the third catalyst regions of the first and second interconnects are arranged along a second line non-parallel to the first and second directions, and the second line is different from the first line, and
the fifth catalyst regions of the first and second interconnects are arranged along a third line non-parallel to the second direction, and the third line is different from the first and second lines.

4. The device according to claim 1, wherein the first and second interconnects have a same thickness.

5. The device according to claim 1, wherein the first and second interconnects each further includes a catalyst foundation layer provided under the catalyst layer.

6. The device according to claim 5, wherein the catalyst foundation layer, the first catalyst region, the third catalyst region, the fifth catalyst region, the first graphene layer, and the second graphene layer have same lengths in a direction perpendicular to the first direction.

7. The device according to claim 1, wherein the first, third and fifth catalyst regions are thicker than the second and fourth catalyst regions.

8. The device according to claim 1, further comprising convex patterns provided under the first, third and fifth catalyst regions.

9. The device according to claim 1, further comprising a plug connected to an upper surface of the first, third, or fifth catalyst region.

10. The device according to claim 9, wherein a material of the plug includes refractory metal.

11. The device according to claim 1, wherein the first and second interconnects are a plurality of bit lines.

12. The device according to claim 1, wherein the first, third, and fifth catalyst regions include impurities.

13. The device according to claim 1, wherein the first and second interconnects extend in the first direction.

14. The device according to claim 1, further comprising an insulating film provided between the first and second interconnects.

\* \* \* \* \*